US007282641B2

(12) United States Patent
Ueno

(10) Patent No.: US 7,282,641 B2
(45) Date of Patent: Oct. 16, 2007

(54) CARD CASE

(75) Inventor: Takashi Ueno, Tokyo (JP)

(73) Assignee: R & B 21, Tokyo (JP)

( * ) Notice: Subject to any disclaimer, the term of this patent is extended or adjusted under 35 U.S.C. 154(b) by 0 days.

(21) Appl. No.: 11/092,832

(22) Filed: Mar. 30, 2005

(65) Prior Publication Data

US 2005/0259407 A1 Nov. 24, 2005

(30) Foreign Application Priority Data

May 24, 2004 (JP) ............................ 2004-153218

(51) Int. Cl.
*H05K 5/06* (2006.01)

(52) U.S. Cl. ................................ 174/50.51; 174/50.54

(58) Field of Classification Search ............... 174/52.4, 174/50.54, 52.5, 50.51; 361/752, 704
See application file for complete search history.

(56) References Cited

U.S. PATENT DOCUMENTS 6,353,538 B1 * 3/2002 Ali et al. .................... 361/728
6,627,814 B1 * 9/2003 Stark ......................... 174/52.3

FOREIGN PATENT DOCUMENTS

| | | |
|---|---|---|
| JP | A 2001-114317 | 4/2001 |
| JP | A 2002-49312 | 2/2002 |
| JP | A 2002-79781 | 3/2002 |
| JP | A 2002-372912 | 12/2002 |

* cited by examiner

*Primary Examiner*—Hung V. Ngo
(74) *Attorney, Agent, or Firm*—Oliff & Berridge, PLC

(57) ABSTRACT

A card case accommodates a card or the like in a hollow portion formed as a result of attachment of a cover member to a bottom member. The cover member has such a structure as to allow reversal of its opposite sides in its attachment to the bottom member. Reversal of the opposite sides of the cover member changes the depth of a planar recess portion of the cover member, the planar recess portion partially constituting the hollow portion. Accordingly, the card case can cope with encapsulation of cards of different thicknesses.

10 Claims, 5 Drawing Sheets

CARD CASE

BACKGROUND OF THE INVENTION

1. Field of the Invention

The present invention relates to a card case for encapsulating a card or the like.

2. Description of the Related Art

In recent years, collectors have collected, exchanged, or traded cards such as trading cards. Trading cards (hereinafter may be referred to merely as cards) have printed thereon photographs of sports personalities, such as baseball players, football players, and basketball players, images of animated characters, photographs of movie stars or scenes, photographs of idols, and the like. Trading cards include game cards. A card can carry a piece of a jersey worn by a sports personality, an autograph of a sports personality, or the like. An IC chip or the like incorporated in a card can contain, for example, audio information and video information pertaining to a sports personality.

Cards of a limited number of issue and rare cards are traded at high prices among collectors.

A grading company evaluates cards to be traded for conditions and assign the cards evaluation points with respect to individual conditions, and an overall evaluation point on a multi-level scale. This evaluation is usually called grading. Graded cards are encapsulated in respective card cases in a sealed condition. The thus-prepared cards are called trading cards. A card case may be used in an unsealed condition and adapted merely to prevent breakage or deterioration of a card or adhesion of stain to the card for preservation of card condition.

Japanese Patent Application Laid-Open (kokai) No. 2002-079781 discloses a trading card having an opening through which can be seen a thin piece of associated memorabilia (a piece of a uniform worn by a sports personality, a of piece of a garment worn by an entertainer, a piece of paper bearing actual writing, or the like) is visible.

Japanese Patent Application Laid-Open (kokai) No. 2002-049312 discloses a trading card allowing bidirectional communication between a card owner and a famous figure appearing thereon by means of recording video or audio information thereon or reproducing such information therefrom.

However, not all cards are of the same thickness. For example, card thickness may differ depending on whether card material is paper or plastic. Also, cards that incorporate an IC chip may be thicker than ordinary cards. Some cards incorporate therein, for example, a piece of a uniform worn by a sports personality, or a piece of paper bearing actual writing, and thus their thickness is increased.

When card cases are to be provided in order to encapsulate distributed cars, various card cases must be prepared so as to cope with different card thicknesses.

SUMMARY OF THE INVENTION

The present invention has been achieved for solving the above problem, and an object of the invention is to provide a card case capable of coping with encapsulation of cards of different thicknesses.

To achieve the above object, the present invention provides a card case comprising first and second plate-like case members so as to accommodate a card in a hollow portion defined between the first and second plate-like case members. The first plate-like case member has fixing means for fixing the first plate-like case member and the second plate-like case member in engagement, and a planar recess portion which partially constitutes the hollow portion. The second plate-like case member has first and second planar recess portions of different depths provided on corresponding opposite sides thereof, and a structure allowing reversal of its opposite sides in its attachment to the first plate-like case member. The second plate-like case member is attached to the first plate-like case member such that selected one of the first and second planar recesses faces the planar recess portion of the first plate-like case member so as to form the hollow portion having one of two different depths.

The hollow portion is formed when the planar recess portion of the first plate-like case member and that of the second plate-like case member are put together.

The card case of the present invention forms a hollow portion having one of two different depths through attachment of the second plate-like case member to the first plate-like case member in such a manner that the first or second planar recess faces the planar recess portion of the first plate-like case member Notably, the opposite sides of the first plate-like case member can also be reversed, so that hollow portions of several different depths can be formed by means of combining the opposite sides of the first and second plate-like case members.

Preferably, the first plate-like case member or the second plate-like case member allows attachment of a protection sheet on at least one side.

Preferably, the depth of the hollow portion can be adjusted by means of attachment of the protection sheet to the first or second plate-like case member on a side toward the hollow portion.

Preferably, ultraviolet-ray protective treatment is performed on at least one of the protection sheet, the first plate-like case member, and the second plate-like case member.

Preferably, the first plate-like case member or the second plate-like case member bears an autograph or seal. In other words, either side of the card case may be surface-treated in such a manner as to bear the autograph or seal of a sports personality or a like figure.

Preferably, an IC chip or memory card is contained in the hollow portion. An IC chip, a memory card, or the like may be contained in the hollow portion along with a card. Alternatively, another hollow portion may be formed for accommodating an IC chip, a memory card, or the like.

Preferably, the first plate-like case member and the second plate-like case member are thermally joined in a sealed condition.

Preferably, the fixing means comprises a fitting-engagement mechanism, a screw-engagement mechanism, or a magnetic-engagement mechanism.

According to the present invention, the depth of the hollow portion, which is defined by the planar recess portion of the first plate-like case member and the planar recess portion of the second plate-like case member, can be changed by reversing the opposite sides of the second plate-like case member when the first and second plate-like case members are joined together. Therefore, the same card case of the present invention can cope with encapsulation of cards of different thicknesses.

DESCRIPTION OF THE PREFERRED EMBODIMENT

An embodiment of the present invention will next be described in detail with reference to the drawings.

1. Structure

1.1 Structure of Card Case 1

Figure 1:
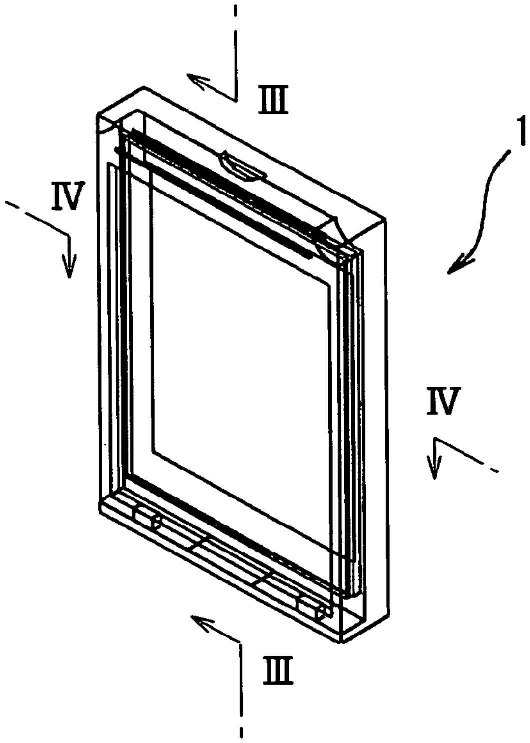
FIG. 1 is a perspective view of a card case according to an embodiment of the present invention.
Figure 2:
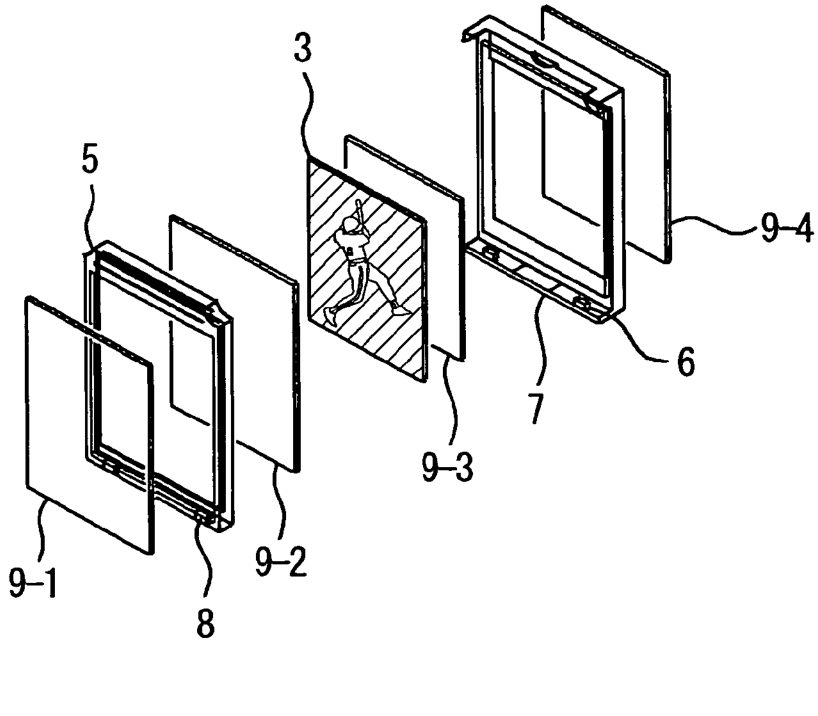
FIG. 2 is an exploded perspective view of the card case.

As shown in FIGS. 1 and 2, a card case 1 is adapted to prevent breakage or deterioration of a card 3 or adhesion of stain to the card 3. The card case 1 contains the card 3 in a space that is formed when a bottom member 7 and a cover member 5 are joined together.

The cover member 5 has such a structure as to allow attachment of protection sheets 9-1 and 9-2 to its corresponding opposite sides. Protection sheets 9-3 and 9-4 can also be attached to corresponding opposite sides of the bottom member 7. The number and position of the protection sheets 9 to be attached to the cover member 5 and bottom member 7 can be determined in accordance with the desire of the client.

The cover member 5 and the bottom member 7 may have grooves formed therein in order to fit the protection sheets 9 into the grooves for fixation of the protection sheets 9. Also, the cover member 5 and the bottom member 7 may have clawlike structures for retaining the protection sheets 9.

In FIG. 2, the protection sheets 9-1 and 9-2 are attached to the corresponding opposite sides of the cover member 5, and the protection sheets 9-3 and 9-4 are attached to the corresponding opposite sides of the bottom member 7. The card 3 to be protected is held between the protection sheets 9-2 and 9-3. A space for housing the card 3 will be described in detail later.

Referring to FIG. 2, the card 3 is placed in a recess portion (which will be described in detail later) of the bottom member 7, to which the protection sheets 9-3 and 9-4 are attached. Then, a foot portion 8 located at a lower portion of the cover member 5, to which the protection sheets 9-1 and 9-2 are attached, is fitted into a hole portion 6 located at a lower portion of the bottom member 7. Finally, a clawlike mechanism located at an upper portion of the bottom member 7 is caused to press a top portion of the cover member 5, thereby fixing the cover member 5 and the bottom member 7 in engagement.

A fixing mechanism for fixing the bottom member 7 and the cover member 5 in engagement is not limited to the above-mentioned mechanism. The fixing mechanism may be embodied in the form of a screw-engagement mechanism or a magnetic-engagement mechanism that uses a magnet or the like.

The cover member 5 and the bottom member 7 are formed from hard, transparent plastic or the like. The protection sheets 9 are formed from transparent, thin film-like plastic or the like. Accordingly, the card 3 encapsulated in the card case 1 is visible from either side of the card case 1.

The cover member 5, the bottom member 7, and the protection sheets 9 may undergo, partially or entirely, ultraviolet-ray protective treatment. Ultraviolet-ray protective treatment is to add an ultraviolet-ray absorbent to the material of the cover member 5, the bottom member 7, and the protection sheets 9, or to coat the surface of the cover member 5, that of the bottom member 7, and those of the protection sheets 9 with the absorbent.

Dimming lenses of glasses, for example, contain a chemical substance that changes an ultraviolet-ray cut rate with ambient brightness (quantity of ultraviolet rays). Such a chemical substance may be added to the material of the cover member 5, the bottom member 7, the protection sheets 9, and accessories such as a case cover. Alternatively, the chemical substance may be applied to the cover member 5, the bottom member 7, the protection sheets 9, and accessories such as a case cover by means of coating. Alternatively, a film containing such a chemical substance may be affixed to the cover member 5, the bottom member 7, the protection sheets 9, and the accessories.

Printing ink for the card 3 or the like is vulnerable to ultraviolet rays. Exposure to ultraviolet rays contained in fluorescent light, sunlight, and the like causes deterioration such as fading over a long period of time. Performing ultraviolet-ray protective treatment on the card case 1 reduces the degree of deterioration of the encapsulated card 3 caused by ultraviolet rays. In some cases, the card 3 itself has ultraviolet-ray protective coating formed thereon.

In the case where the surface of the cover member 5, which is located on the front side of the card case 1, or the surface of the bottom member 7 bears the autograph or seal of a sports personality or a like figure, covering the surface with the protection sheet 9 that has undergone ultraviolet-ray protective treatment reduces the degree of deterioration of the autograph or seal caused by ultraviolet rays.

1.2 Card 3

The card 3 is a photograph of a sports personality, an image of an animated character, a photograph of an actor/actress or idol, or the like. Collectors collect, exchange, or trade the cards 3. In some cases, in order to prevent breakage or deterioration of the card 3 for preservation of card condition, the card 3 may be encapsulated in the card case 1 for storage.

A card grading company evaluates the card 3 for conditions and grades it according to the results of the evaluation. In some cases, the grading company may sonically seal the graded card 3 in the card case 1 by use of a dedicated sealing machine. Alternatively, the grading company may sonically seal the ungraded card 3 in the card case 1 by use of a dedicated sealing machine at a client's request.

The card 3 is formed from plastic, paper, or the like, and a photograph or the like is printed on one side or both sides of the card 3. The card 3 may incorporate therein, for example, an IC chip on which card information is recorded. Card information includes a card grade, card owner information, card trading information, and information (text data, image data, audio or video data, etc.) pertaining to a sports personality or a like figure printed on the card.

In some cases, the card 3 may incorporate therein, for example, a piece of a uniform worn by a sports personality printed on the card 3, a piece of a garment, or a piece of paper bearing actual writing.

As mentioned above, the thickness of the card 3 varies depending on, for example, what material is used to form the card 3 or whether or not the card 3 incorporates therein an IC chip or a piece of clothing or paper. In some cases, an IC chip or flash memory on which card information is recorded may be sealed in the card case 1 independently of the card 3. In other words, a space for accommodating the card 3 is desirably of flexible design.

2. First Hollow Portion

Next will be described a space formed between the cover member 5 and the bottom member 7, which constitute the card case 1, and adapted to accommodate the card 3.

Figure 3:
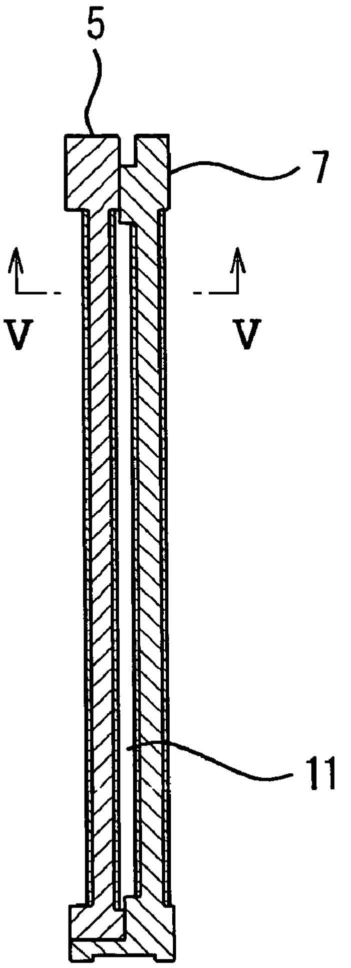
FIG. 3 is a sectional view of the card case taken along line III-III of FIG. 1.
Figure 4:
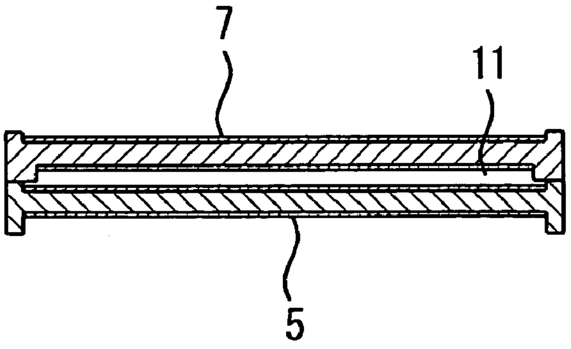
FIG. 4 is a sectional view of the card case taken along line IV-IV of FIG. 1.
Figure 5:
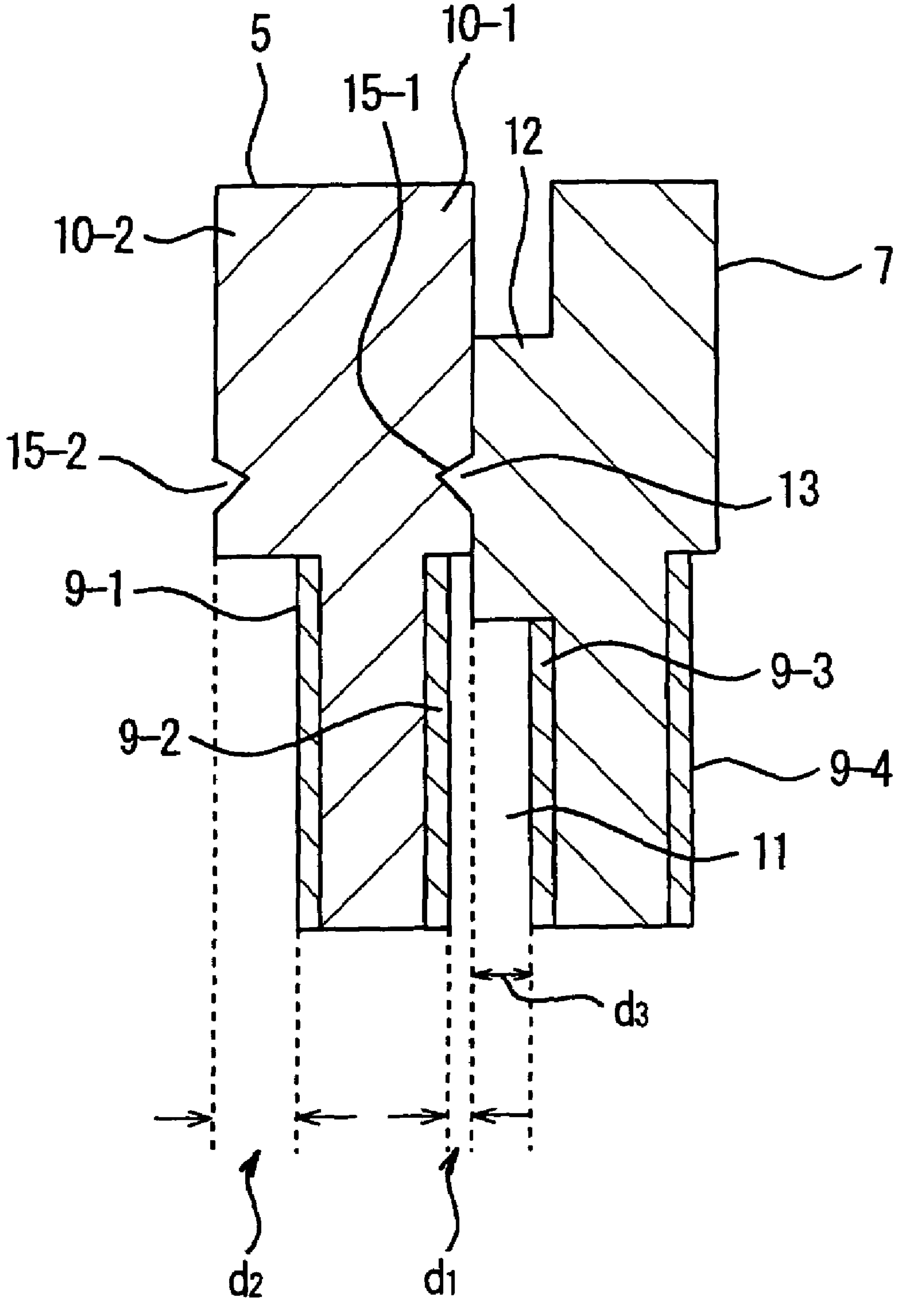
FIG. 5 is an enlarged view of a portion of the card case above line V-V of FIG. 3.

FIGS. 3, 4, and 5 show the card case 1 in which the cover member 5 in the first orientation is attached to the bottom member 7. FIG. 3 is a sectional view of the card case 1 taken along line III-III of FIG. 1. FIG. 4 is a sectional view of the card case 1 taken along line IV-IV of FIG. 1. FIG. 5 is an enlarged view of a portion of the card case 1 above line V-V of FIG. 3.

As shown in FIGS. 1 and 2, in the front view of the cover member 5, the cover member 5 assumes a rectangular, plate-like shape. As shown in FIGS. 3 to 5, planar convex portions 10-1 and 10-2 of different depths are formed on opposite sides of the cover member 5. As shown in FIG. 5, the planar convex portions 10-1 and 10-2 have depths $d_1$ and $d_2$ (herein $d_1<d_2$), respectively, as measured after the protection sheets 9-1 and 9-2 are mounted. The above-mentioned "the case member 5 in the first orientation" means that the case member 5 is oriented such that the shallow recess portion of the depth $d_1$ faces the bottom member 7.

As shown in FIGS. 1 and 2, in the front view of the bottom member 7, the bottom member 7 assumes a rectangular, plate-like shape. As shown in FIGS. 3 to 5, a planar convex portion 12 of a depth $d_3$ is formed on a side toward the cover member 5. As shown in FIG. 5, the bottom member 7 has a projection 13 formed at its frame portion, which comes in close contact with the cover member 5. The projection 13 is formed in a rectangular shape around the planar convex portion 12 of the depth $d_3$. The projection 13 is fitted into a groove 15-1 provided on the cover member 5, thereby preventing mutual dislocation of the bottom member 7 and the cover member 5. The groove 15-1 is formed in a rectangular shape around the planar convex portion 10-1 of the depth $d_1$.

When the cover member 5 in the first orientation is attached to the bottom member 7, their opposite planar convex portions 10-1 and 10-2 form a hollow portion 11. The depth of the hollow portion 11 is the sum of the depths $d_1$ and $d_3$ of the opposite planar convex portions 10-1 and 12.

3. Second Hollow Portion

Figure 6:
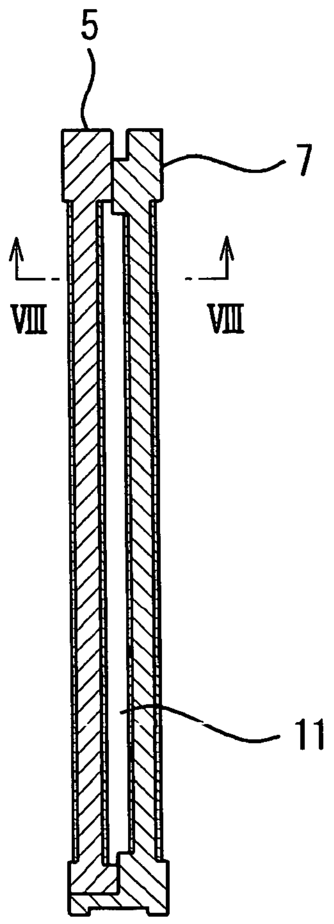
FIG. 6 is a sectional view corresponding to that of FIG. 3, showing a state in which the cover member in the second orientation is attached to the bottom member.
Figure 7:
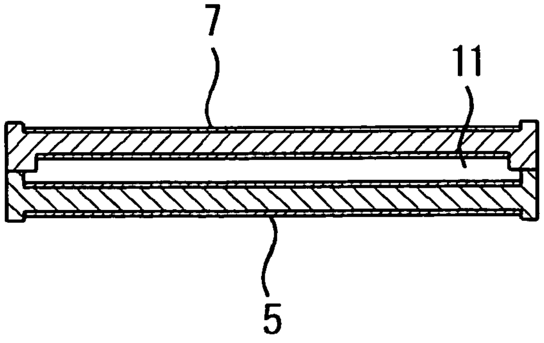
FIG. 7 is a sectional view corresponding to that of FIG. 4, showing the state in which the cover member in the second orientation is attached to the bottom member.
Figure 8:
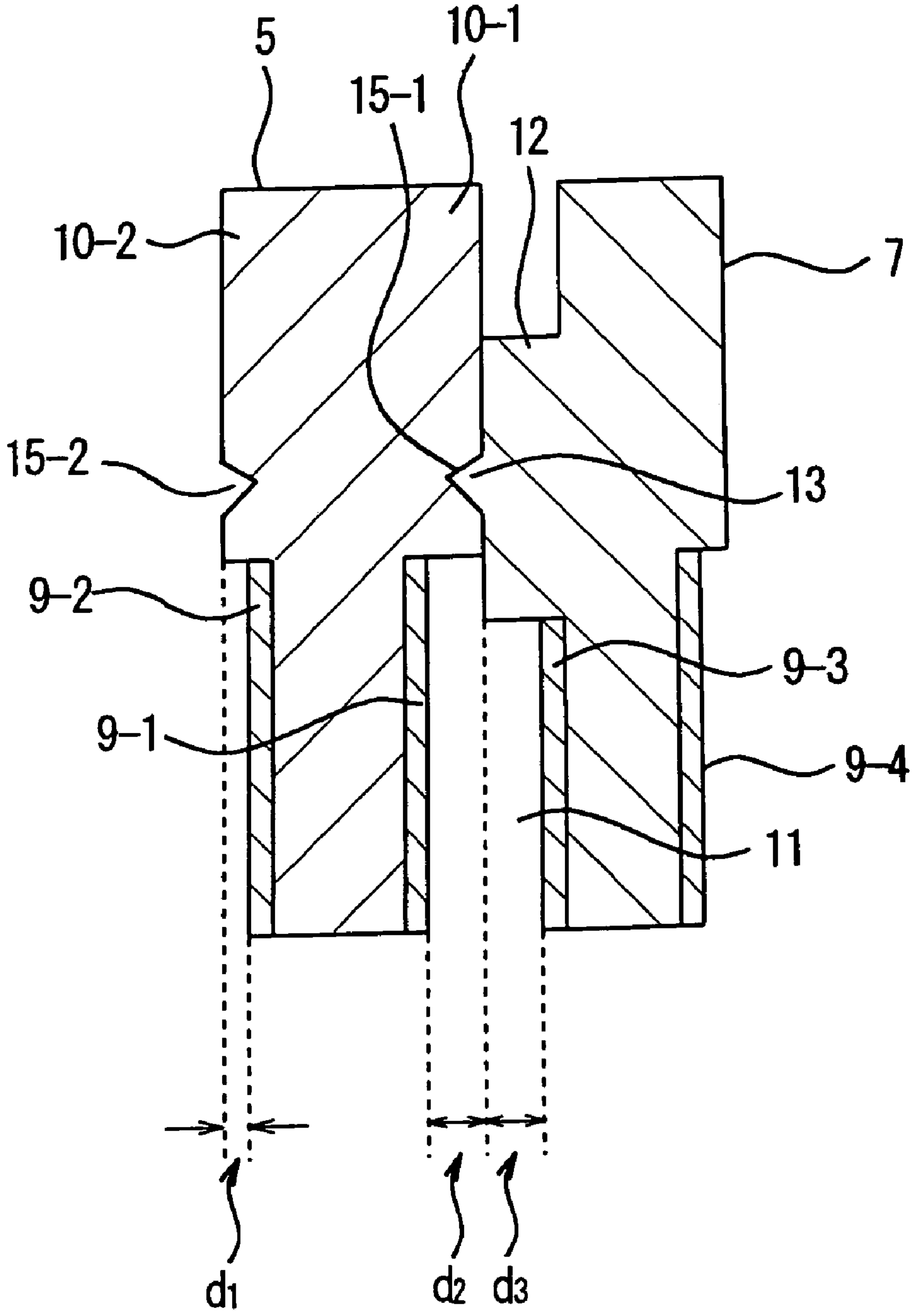
FIG. 8 is an enlarged view of a portion of the card case above line VIII-VIII of FIG. 6.

Next will be described the case where the cover member 5 is attached to the bottom member 7 while the opposite sides of the cover member 5 are reversed from the case described above in "2. First Hollow Portion." FIGS. 6, 7, and 8 show the card case 1 in which the cover member 5 in the second orientation is attached to the bottom member 7. FIG. 6 is a sectional view corresponding to that shown in FIG. 3. FIG. 7 is a sectional view corresponding to that shown in FIG. 4. FIG. 8 is an enlarged view of a portion of the card case 1 above line VIII-VIII of FIG. 6.

When the cover member 5 in the second orientation is attached to the bottom member 7; i.e., when the cover member 5 is attached to the bottom member 7 in such a manner that the deep recess portion of the depth $d_2$ faces the bottom member 7, the projection 13 of the bottom member 7 is fitted into a groove 15-2 (which is formed in a rectangular shape around the planar convex portion 10-2 of the depth $d_2$) of the cover member 5. The cover member 5 and the bottom member 7 are fixed in engagement by unillustrated fixing means (which may be a screw-engagement mechanism or a magnetic-engagement mechanism).

When the cover member 5 in the second orientation is attached to the bottom member 7, their opposite planar convex portions 10-1 and 12 form the hollow portion 11. The depth of the hollow portion 11 is the sum of the depths $d_2$ and $d_3$ of the opposite planar convex portions 10-2 and 12. As compared with the case where the cover member 5 in the first orientation is attached to the bottom member 7, the hollow portion 11 becomes deeper by ($d_2$-$d_1$), so that the hollow portion 11 can accommodate the card 3 of a greater thickness.

The depth of the hollow portion 11 can be finely adjusted by means of selectively mounting the protection sheet 9-3 on the bottom member 7 on the side toward the hollow portion 11 and the protection sheet 9-1 on the cover member 5 on the side toward the hollow portion 11.

The card case 1 may encapsulate not only the card 3 but also a storage medium such as an IC chip or a flash memory, a piece of paper, or the like. For example, the hollow portion 11 may accommodate a storage medium or the like along with the card 3. Alternatively, in addition to the hollow portion 11 for accommodating the card 3, another hollow portion may be provided for such a storage medium or the like.

In the present embodiment, different depths are imparted to the planar recess portions provided on the opposite sides of the cover member 5. Additionally, the planar recess portions may assume different shapes. In this case, by means of reversal of the opposite sides of the cover member 5, the same card case 1 can cope with encapsulation of cards of different shapes.

The number of planar convex portions may differ between the opposite sides of the cover member 5. For example, one side of the cover member 5 allows encapsulation of a single card, whereas the other side of the cover member 5 allows encapsulation of two cards of smaller size.

The present embodiment may be applied to a large-sized card case that can encapsulate a plurality of the cards 3, or the card 3 along with a piece of paper, a piece of cloth, or the like.

Commodity management can be performed by use of IC chips or the like encapsulated in the card cases 1 of the present embodiment.

The card case 1 of the present embodiment allows a card owner, who uses a reader-writer terminal, to read data from an IC chip or the like encapsulated therein and to send the read data to a server of a card administrator. Also, the card case 1 of the present embodiment allows the card administrator to write data onto the encapsulated IC chip or the like via the reader-writer terminal possessed by the card owner.

4. Effect

As described above, the same card case 1 of the present embodiment can cope with encapsulation of cards of different thicknesses by means of reversal of opposite sides of the cover member 5. Accordingly, the present embodiment saves cost and trouble as compared with the case of manufacturing card cases by card thicknesses.

When a client wants to encapsulate in the card case 1 the card 3 along with an additional piece of paper or the like associated with the card 3, he/she may reverse opposite sides of the cover member 5 in such a manner as to form the hollow portion 11 of a greater depth when the cover member 5 is attached to the bottom member 7, thereby coping with encapsulation of the additional piece of paper or the like.

The present embodiment is described while mentioning the card case 1 for encapsulating the card 3. However, an article to be encapsulated in the card case 1 is not limited to the card 3. The card case 1 may be applied to encapsulation of articles of different thicknesses. For example, in the case where the card case 1 is used to encapsulate a photograph, if a card owner wants to encapsulate, in addition to the photograph, a piece of paper associated with the photograph, the card case 1 can cope with such encapsulation by means of an increase of the depth of the hollow portion.

The present invention is not limited to the above-described embodiment. It will be apparent to those skilled in the art that numerous modifications and variations of the present invention are possible in light of the spirit of the present invention, and they are not excluded from the scope of the present invention.

What is claimed is:

1. A card case comprising:

first and second plate-shaped case members so as to accommodate a card in a hollow portion defined between the first and second plate-shaped case members, wherein the second plate-shaped case member has first and second planar recess portions of different thickness, wherein the first and second planar recess portions are on opposite sides of a cover member;

the first plate-shaped case member and the first planar recess portion are attached so that the first plate-shaped case member and the second plate-shaped case member are fixed in a first position;

the first plate-shaped case member and the second planar recess portion are attached by reversing the second plate-shaped case member so that the first plate-shaped case member and the second plate-shaped case member are fixed in a second position; and the hollow portion in the first position and the hollow portion in the second position are different in depth.

2. A card case according to claim 1, wherein the first plate-shaped case member or the second plate-shaped case member allows attachment of a protection sheet on at least one side.

3. A card case according to claim 2, wherein the depth of the hollow portion can be adjusted by means of attachment of the protection sheet to the first or second plate-shaped case member on a side toward the hollow portion.

4. A card case according to claim 2, wherein ultraviolet-ray protective treatment is performed on at least one of the protection sheet, the first plate-shaped case member, and the second plate-shaped case member.

5. A card case according to claim 1, wherein the first plate-shaped case member or the second plate-shaped case member is surface-treated in such a manner as to bear an autograph or seal.

6. A card case according to claim 1, wherein an IC chip or memory card is contained in the hollow portion.

7. A card case according to claim 1, wherein the first plate-shaped case member and the second plate-shaped case member are thermally joined in a sealed condition.

8. A card case according to claim 1, wherein the fixing means comprises a fitting-engagement mechanism, a screw-engagement mechanism, or a magnetic mechanism.

9. A card case according to claim 1, wherein the first plate-shaped case member has a third planar recess portion;

the third planar recess portion and the first planar recess portion are attached so that the first plate-shaped case member and the second plate-shaped case member are fixed in the first position; and the third planar recess portion and the second planar recess portion are attached by reversing the second plate-shaped case member so that the first plate-shaped case member and the second plate-shaped case member are fixed in the second position.

10. A card case according to claim 9, wherein the third planar recess portion has a projection;

both the first planar recess portion and the second planar recess portion have grooves; and the projection fits into the grooves so as to prevent mutual dislocation of the first plate-shaped case member and the second plate-shaped case member.

* * * * *